(12) United States Patent
Mitta et al.

(10) Patent No.: US 8,859,320 B2
(45) Date of Patent: Oct. 14, 2014

(54) METHOD FOR PRODUCING SOLAR CELL AND FILM-PRODUCING DEVICE

(75) Inventors: Ryo Mitta, Annaka (JP); Mitsuhito Takahashi, Annaka (JP); Hiroshi Hashigami, Annaka (JP); Takashi Murakami, Annaka (JP); Shintarou Tsukigata, Annaka (JP); Takenori Watabe, Annaka (KP); Hiroyuki Otsuka, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 13/809,077

(22) PCT Filed: Jul. 12, 2011

(86) PCT No.: PCT/JP2011/065861
§ 371 (c)(1),
(2), (4) Date: Mar. 19, 2013

(87) PCT Pub. No.: WO2012/008436
PCT Pub. Date: Jan. 19, 2012

(65) Prior Publication Data
US 2013/0171763 A1     Jul. 4, 2013

(30) Foreign Application Priority Data

Jul. 15, 2010 (JP) ................................. 2010-160394

(51) Int. Cl.
*H01L 21/00* (2006.01)
*H01L 31/0216* (2014.01)
*H01L 31/068* (2012.01)
*H01L 31/0224* (2006.01)

(52) U.S. Cl.
CPC .......... *H01L 31/02168* (2013.01); *Y02E 10/52* (2013.01); *H01L 31/068* (2013.01); *H01L 31/022425* (2013.01); *Y02E 10/547* (2013.01)
USPC ................. 438/72; 438/34; 438/97; 438/222; 438/245; 257/190; 257/E29.03

(58) Field of Classification Search
USPC ........ 136/244; 257/E21.53, E31.13, E31.119, 257/E31.127; 438/57, 72, 98
See application file for complete search history.

(56) References Cited

U.S. PATENT DOCUMENTS 8,168,462 B2 *   5/2012   Borden et al. .................. 438/57
8,617,641 B2 *  12/2013   Sharma et al. ................. 427/74

(Continued)

FOREIGN PATENT DOCUMENTS

JP    2008-306141 A    12/2008
JP    2009-533864 A     9/2009

(Continued)

OTHER PUBLICATIONS

International Search Report for PCT/JP2011/065861, mailing date of Oct. 25, 2011.

(Continued)

*Primary Examiner* — Mark A Laurenzi
(74) *Attorney, Agent, or Firm* — Westerman, Hattori, Daniels & Adrian, LLP

(57) ABSTRACT

Disclosed in a method that is for producing a solar cell and that is characterized by performing an annealing step on a semiconductor substrate before an electrode-forming step. By means of performing annealing in the above manner, it is possible to improve the electrical characteristics of the solar cell without negatively impacting reliability or outward appearance. As a result, the method can be widely used in methods for producing solar cells having high reliability and electrical characteristics.

10 Claims, 1 Drawing Sheet

(56) References Cited

U.S. PATENT DOCUMENTS

| | | |
|---|---|---|
| 2008/0000519 A1* | 1/2008 | Takahashi ............... 136/252 |
| 2009/0283141 A1 | 11/2009 | Bentzen et al. |
| 2010/0032012 A1 | 2/2010 | Isaka et al. |
| 2011/0045624 A1 | 2/2011 | Tsukigata et al. |

FOREIGN PATENT DOCUMENTS

| | | |
|---|---|---|
| WO | 2008/065918 A1 | 6/2008 |
| WO | 2009/116569 A1 | 9/2009 |
| WO | 2011/133965 A2 | 10/2011 |

OTHER PUBLICATIONS

Extended European Search Report dated Jan. 3, 2014, issued in corresponding European Patent Application No. 11806766.9 (6 pages).

Bentzen et al., "Surface Passivation of Silicon Solar Cells by Amorphous Silicon/Silicon Nitride Dual Layers", International Photovoltaic Science & Engineering Conference, 2005, pp. 316-317, Shanghai, China. "cited in the Extended European Search Report dated Jan. 3, 2014".

* cited by examiner

METHOD FOR PRODUCING SOLAR CELL AND FILM-PRODUCING DEVICE

TECHNICAL FIELD

This invention relates to a method for producing solar cells and a film-forming apparatus.

BACKGROUND ART

In general, the solar cell has the structure shown in FIG. 1. In FIG. 1, a p-type semiconductor substrate 1 is of a plate shape dimensioned 100 to 150 mm squares and 0.1 to 0.3 mm thick, made of polycrystalline or monocrystalline silicon or the like, and doped with a p-type impurity such as boron. An n-type diffusion layer 2 is formed in the substrate by doping an n-type impurity such as phosphorus, and an antireflective coating 3 of silicon nitride (SiN) or the like is formed thereon. A conductive aluminum paste is printed on the back surface by a screen printing technique, before the paste is dried and fired to form a back electrode 6 and a back surface field (BSF) layer 4 at the same time. A conductive silver paste is printed on the front surface, before it is dried and fired to form a collector electrode 5. The solar cell is produced in this way. It is noted that one surface of a substrate which becomes the light-receiving surface of the resulting solar cell is referred to as "front" surface and the other surface of the substrate opposite to the light-receiving surface is referred to as "back" surface.

As mentioned above, for the purpose of reducing any loss of incident light on the front surface, the solar cell includes a thin film of SiN or the like which is formed as an antireflective coating for suppressing surface reflection. It is acknowledged that this thin film forming step serves to form a thin film for suppressing light reflection and is effective for passivating the silicon substrate at the same time. It is known that this passivation capable of reducing the interface state density of silicon substrate is effective for enhancing electrical properties of the solar cell. A thin film formed on the solar cell surface for such purpose is referred to as "passivation" film, hereinafter.

For the purpose of promoting the passivation effect of the antireflective film in the solar cell, efforts are made to develop a CVD apparatus for forming a SiN antireflective film in a polycrystalline silicon solar cell, comprising a CVD chamber where a SiN antireflective film is formed on a polycrystalline silicon substrate, and a heating chamber for maintaining the substrate at the CVD process temperature or heating the substrate at or above the CVD process temperature (see, for example, Patent Document 1: JP-A 2008-306141). The passivation effect promoted by heating by such a method, however, is considered effective for dangling bonds and grain boundary impurities in the bulk of the polycrystalline silicon solar cell. It is thus desired to further enhance the passivation effect.

CITATION LIST

Patent Document

Patent Document 1: JP-A 2008-306141

SUMMARY OF INVENTION

Technical Problem

Therefore, an object of the invention is to provide a method for producing a solar cell having better electrical properties without detriment to reliability and outer appearance, and a film-forming apparatus.

Solution to Problem

Making extensive investigations to attain the above object, the inventors have found that by forming a passivation film and annealing thereafter, the passivation effect of the passivation film can be expanded to a reduction of the interface state density on surface and a reduction of recombination sites in the bulk of monocrystalline silicon solar cell, and further to a reduction of the series resistance of the solar cell. Thus electrical properties of the solar cell are improved. The invention is predicated on this finding.

Accordingly, the invention provides a method for producing a solar cell and a film-forming apparatus, as defined below.

[1] A method for producing a solar cell, comprising the steps of:
  forming an antireflection/passivation film on a semiconductor substrate,
  annealing the substrate, and
  then forming electrodes on the substrate.

[2] The method of [1], further comprising one or both of the step of forming a diffusion layer in the semiconductor substrate and the step of firing the electrodes.

[3] The method of [1] or [2], comprising the steps of forming a diffusion layer in the semiconductor substrate, then forming an antireflection/passivation film on the diffusion layer, then annealing the substrate, and thereafter forming electrodes, the step of forming electrodes including firing the electrodes.

[4] The method of [3] wherein the semiconductor substrate is of p-type, an n-type diffusion layer is formed on a light-receiving surface of the substrate, and the antireflection/passivation film is formed on the diffusion layer prior to the annealing step.

[5] The method of [3] wherein the semiconductor substrate is of n-type, a p-type diffusion layer is formed on a light-receiving surface of the substrate, an n-type diffusion layer is formed on the surface of the substrate opposite to the light-receiving surface, and the antireflection/passivation film is formed on each of the diffusion layers prior to the annealing step.

[6] The method of any one of [3] to [5] wherein the passivation film is any one of $MgF_2$, $SiO_2$, $Al_2O_3$, SiO, SiN, $TiO_2$, $Ta_2O_5$, and ZnS, or a stack of such layers.

[7] The method of any one of [1] to [6] wherein the annealing step is at 200° C. to 1,000° C.

[8] The method of any one of [1] to [7] wherein the time of the annealing step is 10 seconds to 90 minutes.

[9] The method of any one of [1] to [8] wherein the annealing step is in an atmosphere of air, $H_2$, $N_2$, $O_2$ or Ar or a mixture thereof.

[10] A film-forming apparatus comprising means for forming a passivation film and a heating chamber where anneal is carried out subsequent to formation of the passivation film.

Advantageous Effects of Invention

The annealing step is taken in the above-described sequence to improve electrical properties of the solar cell without detriment to reliability and outer appearance. Thus the invention is widely applicable to the production of solar cells having better electrical properties and reliability.

DESCRIPTION OF EMBODIMENTS

Embodiments of the invention are described below in detail. However, the scope of the invention is not limited to the illustrated embodiments because the invention as set forth in the claims can be implemented in a wide variety of embodiments in addition to the illustrated embodiments. The drawings are not depicted to scale. Certain members are depicted in enlarged scale in order to clarify the description and understanding of the invention whereas insignificant parts are not depicted.

Figure 1:
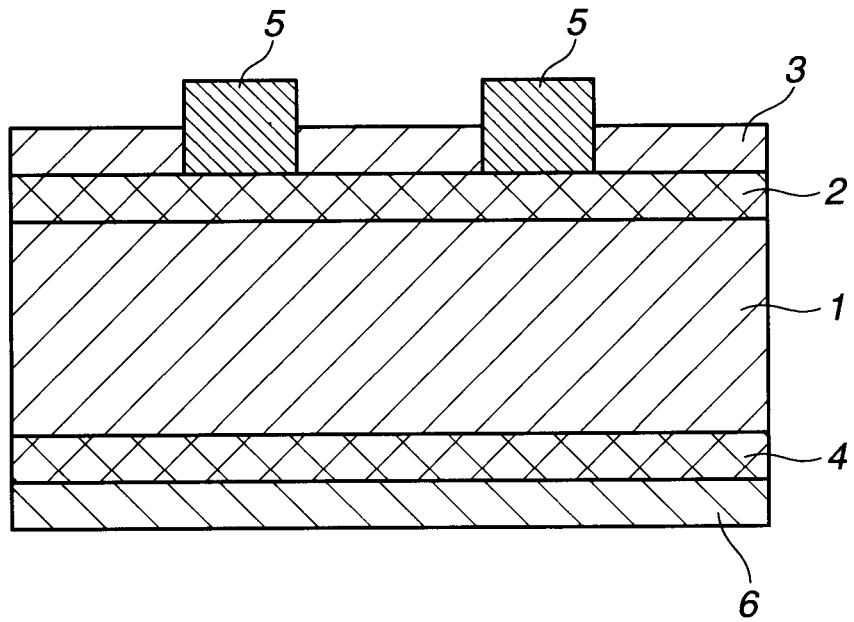
FIG. 1 is a cross-sectional view showing an exemplary solar cell whose back surface is entirely covered with an electrode.

As indicated above, FIG. 1 is a cross-sectional view showing the structure of a general solar cell. Illustrated in FIG. 1 are a semiconductor substrate 1, a diffusion region 2, an antireflection/passivation film 3, a BSF layer 4, a front electrode 5, and a back electrode 6.

Now the method of producing the solar cell of FIG. 1 is described. First, a semiconductor substrate 1 is provided. The semiconductor substrate 1 is of monocrystalline or polycrystalline silicon or the like, and may be of p-type or n-type. Most often, the semiconductor substrate 1 is a p-type silicon substrate doped with a p-type impurity such as boron and having a resistivity of 0.1 to 4.0 Ω-cm.

Below, the method of producing a solar cell using a p-type silicon substrate is described as a typical embodiment. The semiconductor substrate used is preferably of plate shape having dimensions of 100 to 150 mm squares and a thickness of 0.05 to 0.30 mm. The surface of p-type silicon substrate that corresponds to the light-receiving surface of a solar cell is provided with a rugged structure known as texture, for example, by immersing in an acidic solution to remove surface damages caused by slicing or the like, chemically etching in alkaline solution, cleaning, and drying. The rugged structure induces multiple reflections of light at the light-receiving surface of a solar cell. Therefore, by forming a rugged structure, effective reflectance is reduced, and conversion efficiency is improved.

Next, the p-type silicon substrate is placed in a hot gas containing $POCl_3$, for example, at about 850° C. or higher, followed by a thermal diffusion method of diffusing n-type impurity such as phosphorus into the p-type silicon substrate over its entire surface, thereby forming an n-type diffusion layer 2 having a sheet resistance of about 30 to 300 ohm/squares (Ω/□) in the front surface. It is noted that when the n-type diffusion layer is formed by thermal diffusion, the n-type diffusion layers may be formed on opposite surfaces and end surfaces of the p-type silicon substrate as well. In this case, unnecessary n-type diffusion layers may be removed by immersing the p-type silicon substrate, in which the surface of the necessary n-type diffusion layer is covered with an acid resistant resin, in fluoronitric acid solution. Thereafter, the vitreous layer formed on the semiconductor substrate surface during diffusion is removed by immersing in a chemical solution such as dilute hydrofluoric acid solution, followed by rinsing with deionized water.

Further, an antireflection/passivation film 3 is formed on the front surface of the p-type silicon substrate. The antireflection/passivation film 3 is typically made of SiN and formed by plasma-enhanced CVD, for example. A gas mixture of $SiH_4$ and $NH_3$ is diluted with $N_2$, and a gas plasma is created by glow discharge decomposition, from which SiN is deposited. The antireflection/passivation film is formed so as to have a refractive index of about 1.8 to 2.3, with the refractive index difference from the p-type silicon substrate taken into account, and a thickness of about 500 to 1,000 angstroms (Å) for the purpose of preventing light from being reflected by the surface of p-type silicon substrate so that light may be effectively taken into the p-type silicon substrate. The SiN also functions as a passivation film which is effective for passivating the n-type diffusion layer during formation. The passivation effect combined with the antireflection effect improves electrical properties of a solar cell.

Next, a conductive paste containing aluminum, glass frit, varnish and the like, for example, is screen printed and dried on the back surface of the substrate. Subsequently, a conductive paste containing silver, glass frit, varnish and the like, for example, is screen printed and dried on the front surface. Thereafter, the pastes for the respective electrodes are fired at a temperature of about 500 to 950° C., whereby a BSF layer 4, front electrode 5 and back electrode 6 are formed. Although the screen printing technique is described as a typical electrode forming technique, electrodes may also be formed by evaporation, sputtering or the like.

The typical method of producing a crystalline silicon solar cell as described above fails to produce a solar cell with satisfactory electrical properties because the interface state density on the front surface and the number of recombination sites within the semiconductor substrate are not fully reduced. In contrast, the method of producing a solar cell according to the invention intends to enhance electrical properties of a solar cell by adding an anneal step after the SiN film-forming step based on plasma-enhanced CVD. The structure is annealed in an atmosphere of air, $H_2$, $N_2$, $O_2$ or Ar or a mixture of two or more of the foregoing, at a temperature of 200° C. to 1,000° C. for a time of 30 seconds to 60 minutes. Electrical properties are improved by the anneal step for the following reason.

In case of typical crystalline silicon solar cells, the semiconductor substrate contains in its bulk or on its surface many crystal defects, associated with heavy metal impurities (e.g., Cu, Fe) and trace impurities such as oxygen and carbon, and many recombination sites such as dangling bonds. Consequently, carriers generated by incident light are recombined, resulting in the crystalline silicon solar cell having a short lifetime. As a result, electrical properties of the solar cell are not at all enhanced. If the solar cell is annealed at this point of time, then the passivation effect that hydrogen contained in the SiN film terminates dangling bonds on the surface to reduce the interface state density, and the getter effect that the phosphor introduced during formation of n-type diffusion layer traps the heavy metal are promoted, resulting in the crystalline silicon solar cell having a long lifetime. As a result, electrical properties of the solar cell are enhanced. Since hydrogen in the SiN film is reduced by annealing, the composition of the SiN film is changed, and consequently, the quantity of positive charges in the SiN film is increased or the SiN film is altered to allow the silver electrode to make a contact with Si. Then the series resistance of the solar cell may be reduced. These phenomena are found not only in polycrystalline silicon solar cells, but also in monocrystalline silicon solar cells. As a result, solar cells having better electrical properties can be produced without detriment to reliability and outer appearance.

In the method of producing a solar cell according to the invention, too high an annealing temperature allows for re-release of impurities from getter sites. Too low an annealing temperature fails to exert a sufficient passivation effect of $H_2$. From the standpoint of better passivation and getter effects, the annealing temperature is preferably 200° C. to 1,000° C., more preferably 400° C. to 900° C., and even more preferably 500° C. to 850° C.

In the method of producing a solar cell according to the invention, if the annealing time is too long, the passivation effect is adversely affected by re-release of impurities from getter sites and desorption of hydrogen from the once terminated dangling bonds. If the annealing time is too short, no sufficient getter and passivation effects are obtainable. From the standpoint of better passivation and getter effects, the annealing time is preferably 10 seconds to 90 minutes, more preferably 20 seconds to 50 minutes, and even more preferably 30 seconds to 30 minutes.

In the method of producing a solar cell according to the invention, the annealing atmosphere is not particularly limited, but annealing in a reducing atmosphere is rather preferred. This is because it becomes possible to prevent precipitation of oxygen within the silicon substrate and to promote the passivation effect of $H_2$. Accordingly, from the standpoint of better passivation and getter effects, the annealing atmosphere is preferably air, $H_2$, $N_2$, $O_2$ or Ar or a mixture thereof, more preferably $H_2$, $N_2$, or Ar or a mixture thereof, and even more preferably $H_2$ or $N_2$ or a mixture thereof.

In the method of producing a solar cell according to the invention, the antireflection/passivation film is not particularly limited. The passivation film may be selected from a variety of films, for example, of $MgF_2$, $SiO_2$, $Al_2O_3$, SiO, SiN, $TiO_2$, $Ta_2O_5$, or ZnS, or a stack of such layers. The composition of passivation film is not stoichiometrically limited and any ratio of atoms may be used.

In the method of producing a solar cell according to the invention, the annealing profile is not particularly limited. One exemplary annealing profile may include a first stage of annealing at a temperature of 600 to 900° C., specifically 850° C. for 10 seconds to 5 minutes, specifically 30 seconds and a second stage of annealing at a temperature of 200 to 600° C., specifically 500° C. for 30 seconds to 10 minutes, specifically 5 minutes. With this profile, the first stage promotes the passivation effect by terminating dangling bonds, and the second stage promotes the getter effect by suppressing re-release of impurities. Additionally, a third stage of annealing or more may be included. Then a solar cell with even better electrical properties may be produced.

In the method of producing a solar cell according to the invention, the annealing means in the annealing step is not particularly limited. Any of annealing means may be used, for example, a continuous annealing furnace using lamp heaters or a batchwise horizontal furnace. In the case of multi-stage annealing as mentioned just above, the annealing step need not be a single process. The annealing step may be divided into first, second and later stages of annealing. In different stages, the apparatus may be either identical or separate.

In the method of producing a solar cell according to the invention, the timing of the annealing step is not particularly limited. Preferably the annealing step is after the formation of diffusion layer, and more preferably after the formation of antireflection/passivation film. The annealing step after the formation of diffusion layer is preferred because more getter sites are available, and thus the getter effect by annealing is more promoted. The annealing step after the formation of passivation film is preferred because the passivation effect by annealing due to termination of dangling bonds is more promoted, and furthermore, the quantity of electric charges to the passivation film is increased, the ability of silver electrode to form a contact with the Si substrate is enhanced, and thus the series resistance of a solar cell can be reduced.

In the method of producing a solar cell according to the invention, after the passivation film is formed in a passivation film-forming apparatus, the annealing step may be consecutively carried out in the same apparatus. This embodiment not only eliminates a need to install an extra separate apparatus for the annealing step, but also has the advantage that the annealing step exerts its effect to the maximum. In this embodiment, the annealing step may be carried out in a heating chamber which is disposed downstream of a film-forming chamber of the film-forming apparatus. Alternatively, the annealing step may be carried out in the film-forming chamber subsequent to film formation. Also, the film-forming apparatus used herein may be of CVD or PVD mode.

In the method of producing a solar cell according to the invention, the conductivity type of a semiconductor substrate may be either p-type or n-type. While the method of producing a solar cell whose back surface is entirely covered with an electrode is as described above, for example, the invention is also applicable to a solar cell whose back surface is passivated. As one embodiment, the method of producing a solar cell using an n-type silicon substrate is described below. However, the invention may be implemented in a wide variety of embodiments in addition to the following one. The scope of the invention is not limited to the following embodiment, but the invention will include all embodiments falling within the scope of the appended claims.

Figure 2:
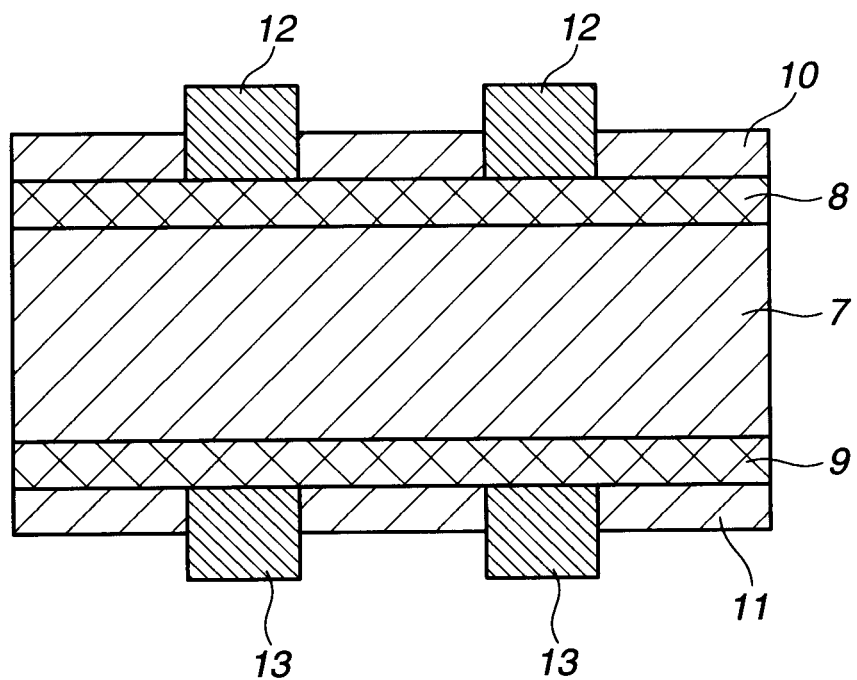
FIG. 2 is a cross-sectional view of an exemplary solar cell of back passivation type.

FIG. 2 is a cross-sectional view showing the structure of a general solar cell of the back passivation type. Illustrated in FIG. 2 are a semiconductor substrate 7, diffusion regions 8 and 9, antireflection/passivation films 10 and 11, a front electrode 12, and a back electrode 13.

It is described how to manufacture the solar cell of FIG. 2. The semiconductor substrate 7 used herein is often an n-type silicon substrate doped with an n-type impurity such as phosphorus and having a resistivity of 0.1 to 4.0 Ω-cm. The n-type silicon substrate may be either monocrystalline or polycrystalline silicon. The substrate used is preferably of plate shape having dimensions of 100 to 150 mm squares and a thickness of 0.05 to 0.30 mm. The surface of n-type silicon substrate that corresponds to the light-receiving surface of a solar cell is provided with a rugged structure known as texture, for example, by immersing in an acidic solution to remove surface damages caused by slicing or the like, chemically etching in alkaline solution, cleaning, and drying.

Next, a mask of SiN or the like is formed only on the back surface of the n-type silicon substrate by the plasma-enhanced CVD mentioned above. The n-type silicon substrate is placed in a hot gas containing $BBr_3$, for example, at about 800° C. or higher, followed by a thermal diffusion method of diffusing p-type impurity element such as boron into only the front surface of the n-type silicon substrate, thereby forming a p-type diffusion layer 8 having a sheet resistance of about 30 to 300Ω/☐ in the front surface. Then the n-type silicon substrate is immersed in hydrofluoric acid solution, for example, to etch away the SiN and the vitreous layer formed on the n-type silicon substrate surface during diffusion. Thereafter, a mask of SiN or the like is formed only on the p-type diffusion layer at the front surface side by the plasma-enhanced CVD mentioned above. The n-type silicon substrate is placed in a hot gas containing $POCl_3$, for example, at about 800° C. or higher, followed by a thermal diffusion method of diffusing n-type impurity element such as phosphorus into only the back surface of the n-type silicon substrate, thereby forming an n-type diffusion layer 9 having a sheet resistance of about 30 to 300Ω/□ in the back surface. Then the n-type silicon substrate is again immersed in hydrofluoric acid solution, for example, to etch away the SiN and the vitreous layer formed on the n-type silicon substrate surface during diffusion.

Further, an antireflection/passivation film 10 is formed on the front surface of n-type silicon substrate. The antireflection/passivation film 10 is typically made of SiN and formed by plasma-enhanced CVD, for example. A gas mixture of $SiH_4$ and $NH_3$ is diluted with $N_2$, and a gas plasma is created by glow discharge decomposition, from which SiN is deposited. The antireflection/passivation film is formed so as to have a refractive index of about 1.8 to 2.3, with the refractive index difference from the n-type silicon substrate taken into account, and a thickness of about 500 to 1,000 Å for the purpose of preventing light from being reflected by the surface of n-type silicon substrate so that light may be effectively taken into the n-type silicon substrate. The SiN also functions as a passivation film having a passivation effect to the p-type diffusion layer during formation. The passivation effect combined with the antireflection effect improves electrical properties of a solar cell. Although the antireflection/passivation film of SiN is described herein as a typical example, it may be any of $MgF_2$, $SiO_2$, $Al_2O_3$, SiO, SiN, $TiO_2$, $Ta_2O_5$ and ZnS, or even a stack of such layers, as alluded to previously.

Subsequently, an antireflection/passivation film 11 is formed on the back surface of n-type silicon substrate. The antireflection/passivation film 11 is typically made of SiN and formed by plasma-enhanced CVD, for example. A gas mixture of $SiH_4$ and $NH_3$ is diluted with $N_2$, and a gas plasma is created by glow discharge decomposition, from which SiN is deposited. The antireflection/passivation film is formed so as to have a refractive index of about 1.7 to 2.4 and a thickness of about 500 to 3,000 Å, with the passivation effect on n-type diffusion layer mainly taken into account. The film mainly functions as a passivation film having a passivation effect to the n-type diffusion layer. The passivation effect combined with the antireflection effect improves electrical properties of a solar cell. Although the antireflection/passivation film of SiN is described herein as a typical example, it may be any of $MgF_2$, $SiO_2$, $Al_2O_3$, SiO, SiN, $TiO_2$, $Ta_2O_5$ and ZnS, or even a stack of such layers, as alluded to previously. Although the antireflection/passivation film on the front surface is first formed and the antireflection/passivation film on the back surface is later formed in the illustrated embodiment, the order of formation of antireflection/passivation films may be first on the back surface and later on the front surface.

Once the antireflection/passivation films are formed on the front and back surfaces as described above, annealing treatment is carried out by the above-described procedure.

Next, a conductive paste containing silver, glass frit, varnish and the like, for example, is screen printed and dried on the back surface of the substrate. Subsequently, a conductive paste containing silver, glass frit, varnish and the like, for example, is screen printed and dried on the front surface. Thereafter, the pastes for the respective electrodes are fired at a temperature of about 500 to 950° C., whereby a front electrode 12 and a back electrode 13 are formed. Although the screen printing technique is described as a typical electrode forming technique, electrodes may also be formed by evaporation, sputtering or the like.

In the method of producing a crystalline silicon solar cell using an n-type silicon substrate as described above, the diffusion layer having a high interface state density to be passivated by the passivation film is on both the front and back surfaces. Therefore, the effect of improving electrical properties by applying the annealing step typically after formation of the antireflection/passivation film is greater than the effect on use of a p-type silicon substrate.

EXAMPLES

Examples and Comparative Examples are given below for further illustrating the invention, but the invention is not limited thereto.

Example and Comparative Example

A p-type silicon substrate of boron-doped p-type monocrystalline silicon which had been sliced to a thickness of 0.2 mm and had a resistivity of about 1 Ω-cm was machined along the outer periphery into a square plate of 15 cm per side. The p-type silicon substrate was immersed in fluoronitric acid solution for 15 seconds for etching the damaged layer, chemically etched for 5 minutes in a solution containing 2 wt % KOH and 2 wt % isopropyl alcohol (IPA) at 70° C., washed with deionized water, and dried, whereby a texture was formed on the surface of the p-type silicon substrate. Next, the p-type silicon substrate was placed in a $POCl_3$ gas atmosphere and subjected to thermal diffusion at a temperature of 870° C. for 30 minutes, thereby forming an n-type layer on the p-type silicon substrate. The n-type layer had a sheet resistance of about 40 ohm/square (Ω/□) and a depth of 0.4 μm. An acid resistant resin was coated on the n-type layer, after which the p-type silicon substrate was immersed in fluoronitric acid solution for 10 seconds to remove the n-type layer where the acid resistant resin coating was absent. Thereafter, the acid resistant resin coating was removed, obtaining a p-type silicon substrate having an n-type layer only on the front surface. Subsequently, by plasma-enhanced CVD using $SiH_4$, $NH_3$ and $N_2$, an SiN film as antireflection/passivation film was deposited to a thickness of 1,000 Å on the n-type layer-bearing surface of the p-type silicon substrate.

Subsequently, the p-type silicon substrate was annealed in a batchwise horizontal furnace under conditions: a $N_2$ atmosphere, a temperature of 600° C. and a time of 10 minutes. The sample substrates were divided into two groups, the substrates in one group were annealed (Example) whereas the substrates in the other group were not annealed (Comparative Example). On the back surface of p-type silicon substrates of both the groups, a conductive aluminum paste was printed and dried at 150° C. Thereafter, on the front surface of p-type silicon substrates of both the groups, a collector electrode was formed in a batchwise horizontal furnace by applying a conductive silver paste by the screen printing technique and drying at 150° C. Subsequently, the substrates as treated thus far were admitted into a firing furnace where the conductive pastes were fired at a maximum temperature of 800° C. to form electrodes, completing solar cells. Electrical properties of these solar cells were measured.

Table 1 shows average values of electrical properties of ten solar cells produced as above in Example or Comparative Example.

TABLE 1

|  | Short-circuit current (mA/cm$^2$) | Open circuit voltage (mV) | Fill factor (%) | Conversion efficiency (%) |
|---|---|---|---|---|
| Comparative Example | 34.2 | 621 | 77.4 | 16.4 |
| Example | 34.9 | 625 | 77.6 | 16.9 |

As seen from Table 1, electrical properties of solar cells are improved by the annealing step according to the invention, with the improvement in conversion efficiency being an absolute value of 0.5%.

REFERENCE SIGNS LIST 1 semiconductor substrate
2 diffusion region
3 antireflection/passivation film
4 BSF layer
5 front electrode
6 back electrode
7 semiconductor substrate
8 diffusion region
9 diffusion region
10 antireflection/passivation film
11 antireflection/passivation film
12 front electrode
13 back electrode

The invention claimed is:

1. A method for producing a solar cell, comprising, in the recited order, the steps of:
   forming an antireflection/passivation film on a semiconductor substrate,
   annealing the substrate,
   forming electrodes on the substrate, and
   firing the electrodes,
   wherein the passivation film is any one of $MgF_2$, $SiO_2$, $Al_2O_3$, SiO, SiN, $TiO_2$, $Ta_2O_5$, and ZnS, or a stack of such layers.

2. The method of claim 1, further comprising the step of forming a diffusion layer in the semiconductor substrate before the step of forming the antireflection/passivation film.

3. The method of claim 1 wherein the semiconductor substrate is of p-type, an n-type diffusion layer is formed on a light-receiving surface of the substrate before the step of forming the antireflection/passivation film.

4. The method of claim 1 wherein the semiconductor substrate is of n-type, a p-type diffusion layer is formed on a light-receiving surface of the substrate, an n-type diffusion layer is formed on the surface of the substrate opposite to the light-receiving surface, and the antireflection/passivation film is formed on each of the diffusion layers.

5. The method of claim 1 wherein the annealing step is at 200° C. to 1,000° C.

6. The method of claim 1 wherein the time of the annealing step is 10 seconds to 90 minutes.

7. The method of claim 1 wherein the annealing step is in an atmosphere of air, $H_2$, $N_2$, $O_2$ or Ar or a mixture thereof.

8. A film-forming apparatus for forming an antireflection/passivation film used in the method of claim 1 comprising:
   means for forming the antireflection/passivation film and
   a heating chamber where the annealing step is carried out after formation of the antireflection/passivation film.

9. A method for producing a solar cell, comprising, in the recited order, the steps of:
   forming an antireflection/passivation film on a semiconductor substrate,
   annealing the substrate, and
   then forming electrodes on the substrate,
   wherein the semiconductor substrate is of p-type, an n-type diffusion layer is formed on a light-receiving surface of the substrate before the step of forming the antireflection/passivation film.

10. A method for producing a solar cell, comprising, in the recited order, the steps of:
    forming an antireflection/passivation film on a semiconductor substrate,
    annealing the substrate, and
    then forming electrodes on the substrate,
    wherein the semiconductor substrate is of n-type, a p-type diffusion layer is formed on a light-receiving surface of the substrate, an n-type diffusion layer is formed on the surface of the substrate opposite to the light-receiving surface, and the antireflection/passivation film is formed on each of the diffusion layers.

* * * * *